(12) United States Patent
Weis

(10) Patent No.: US 6,610,573 B2
(45) Date of Patent: Aug. 26, 2003

(54) METHOD FOR FORMING A SINGLE WIRING LEVEL FOR TRANSISTORS WITH PLANAR AND VERTICAL GATES ON THE SAME SUBSTRATE

(75) Inventor: Rolf Weis, Wappinger Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/888,193

(22) Filed: Jun. 22, 2001

(65) Prior Publication Data

US 2002/0197801 A1 Dec. 26, 2002

(51) Int. Cl.[7] ............... H01L 21/00; H01L 21/336
(52) U.S. Cl. ........................................... 438/268
(58) Field of Search .................. 438/152, 243, 438/585, 206, 209, 212, 268; 257/296

(56) References Cited

U.S. PATENT DOCUMENTS

| | | | | |
|---|---|---|---|---|
| 5,627,092 A | * | 5/1997 | Alsmeier et al. | 438/152 |
| 6,143,635 A | * | 11/2000 | Boyd et al. | 438/585 |
| 6,172,390 B1 | * | 1/2001 | Rupp et al. | 257/296 |
| 6,190,971 B1 | * | 2/2001 | Gruening et al. | 438/243 |
| 6,200,851 B1 | * | 3/2001 | Arnold | 438/243 |

FOREIGN PATENT DOCUMENTS

EP    0 977 256 A2    2/2000    ....... H01L/21/8242

OTHER PUBLICATIONS

Gruening, et al., "A Novel Trench DRAM Cell with a VERtIcal Access Transistor and BuriEd STrap (VERI BEST) for 4Gb/16Gb", IEEE, 1999.

Radens, et al., "An Orthogonal 6F$^2$ Trench–Sidewall Vertical Device Cell for 4Gb/16Gb DRAM", 2000. (Abstract Only).

* cited by examiner

*Primary Examiner*—William David Coleman
(74) *Attorney, Agent, or Firm*—Slater & Matsil, L.L.P.

(57) ABSTRACT

A memory cell comprises a region containing one or more vertical pass transistor, and a support region containing, e.g. one or more planar transistors. During processing, a polysilicon layer is formed for the planar devices gate. The polysilicon layer is removed from the array region by etching with a first etch mask. A subsequently formed insulating oxide layer is formed and removed from over the polysilicon (i.e. the support region) by etching with a second etch mask. Because the polysilicon layer is left intact only where it is needed, above the region with the planar devices, and the oxide layer is left intact only where it is needed, above the region with the vertical devices, the resulting structure has a substantially planar top surface, allowing for optional subsequent metal depositions and structuring as a wiring level.

15 Claims, 4 Drawing Sheets

METHOD FOR FORMING A SINGLE WIRING LEVEL FOR TRANSISTORS WITH PLANAR AND VERTICAL GATES ON THE SAME SUBSTRATE

CROSS REFERENCE TO RELATED APPLICATION

This application is related to co-pending, co-assigned patent application Ser. No. 09/888,202, which application is incorporated herein by reference.

FIELD OF THE INVENTION

This invention relates generally to electrical circuits on semiconductor substrates, specifically on trench DRAM architecture and more specifically to a process for forming a top oxide on an array of memory cells using vertical transistors whereas the support contains planar transistors.

BACKGROUND OF THE INVENTION

The primary driving motivator in commercial memory cells and architecture is the desire to pack more memory capability into a smaller integrated circuit. This goal necessarily involves competing trade-offs in cost, circuit complexity, power dissipation, yield, performance, and the like. Trench capacitors are known in the art as an architecture whereby the overall size (in terms of surface area or chip "real estate") of the memory cell is reduced. The size reduction is accomplished by taking a planar capacitor element of the memory cell and forming the capacitor instead in a trench.

As is known in the art, a typical DRAM cell includes a capacitor upon which is stored a charge (or no charge depending upon the cell's state) and a pass transistor, which is used to charge the capacitor during writing and in the read process to pass the charge on the capacitor to a sense amplifier. In current manufacturing, planar transistors are used for the pass transistors and for the support circuits. Such planar transistors have a critical dimension of gate length that cannot be shrunk below approximately 110 nm maintaining the on and off current required for DRAM retention. Below that size, the transistor performance becomes degraded and is very sensitive to process tolerances. As such, for DRAM cells that are desired to be shrunk, vertical transistors have been proposed for the array. See, for instance, Ulrike Gruening et al., IEDM Tech.Dig. p. 25 (1999) and Carl Radens et al., IEDM Tech.Dig. p. 15.1.1 (2000). Vertical transistors require additional processing, however, thus leading to additional overall costs in manufacturing the device.

Furthermore, the unique processing steps required for vertical gate transistors require modified process flows for manufacturing the memory arrays. The process steps involved in forming the vertical array transistors will deviate from the steps involved in forming the "support" transistors (such as the sense amps, wordline decoder and periphery circuits). Because of this, a need exists in the art for a manufacturing process in which both vertical gate array transistors and planar support transistors can be manufactured on the same semiconductor substrate without unnecessary additional process steps that can add to the cost and reduce the manufacturing yield of the resulting chips. A solution that allows the use of the same wiring layer for the vertical transistors gates as is already used for the formation of the gates of the planar transistors would provide further advantage.

SUMMARY OF THE INVENTION

In one aspect, the present invention provides for a method for forming one wiring connection for vertical and planar transistors together in an electrical circuit on a substrate, the substrate having a surface including regions comprising vertical transistors formed therein and other regions comprising planar transistors formed therein. The method includes forming a vertical transistor on a sidewall of a trench formed within the surface, having a vertical gate formed within the trench and extending above surface, growing a planar gate oxide over both the surface and the vertical gate extending above the surface, depositing a conductive layer on the surface, and forming an etch mask on top of the conductive layer. The etch mask exposes the regions comprising vertical transistors formed therein and covers the regions comprising planar transistors formed therein. The method further includes etching the conductive layer in the exposed regions, removing the etch mask, forming a thick oxide layer on the surface, removing the thick oxide layer from the regions comprising planar transistors formed therein and from the vertical gate extending above the surface, and forming a conductor above and contacting the vertical gate extending above the surface, wherein the conductor is insulated from doped regions adjacent the trench by the thick oxide layer.

In another aspect, the invention provides for memory cell array comprising an array region and a support region. The array region comprises an active trench having a gate polysilicon layer formed therein and having a gate oxide formed on a sidewall thereof, the gate polysilicon having a stud protruding above bulk silicon surrounding said trench. The array region further comprises a doped region formed within bulk silicon adjacent the trench and an oxide layer formed over the bulk silicon adjacent the trench. The support region comprises a planar transistor having a first and second doped region formed within bulk silicon, and having a gate oxide formed above the bulk silicon adjacent the first and second doped regions and a polysilicon layer formed above the gate oxide. The memory cell array further comprises an isolation trench adjacent the active trench. The oxide layer overlies a portion of the isolation trench and the polysilicon overlies a portion of the isolation trench and is adjacent the oxide layer.

The preferred embodiments of the present invention provide the advantage of manufacturing simplicity in that the number of masks and photolithographic steps in forming both planar devices and vertical devices in a single substrate is minimized.

The preferred embodiments provide the further advantage that the conductors and nitride cap of the finished devices are substantially planar, thus simplifying subsequent processing steps.

Additionally, because the thick oxide layer is applied late in the process, it can be used to insulate the vertical gate from surrounding active regions, thus minimizing misalignment tolerance.

The above features of the present invention will be more clearly understood from consideration of the following descriptions in connection with accompanying drawings.

DETAILED DESCRIPTION OF ILLUSTRATIVE EMBODIMENTS

The making and use of the various embodiments are discussed below in detail. However, it should be appreciated that the present invention provides many applicable inventive concepts, which can he embodied in a wide variety of specific contexts. The specific embodiments discussed are merely illustrative of specific ways to make and use the invention, and do not limit the scope of the invention.

Figure 1A:
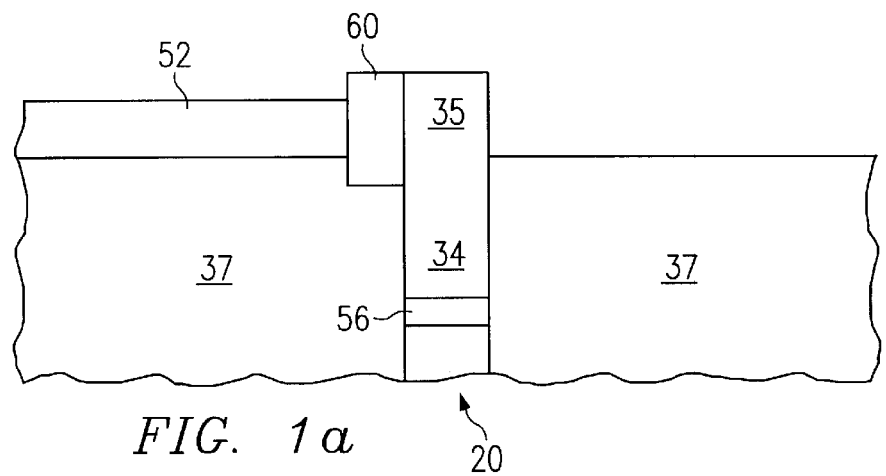
FIGS. 1a and 1b illustrate in cross-sectional view intermediate steps in the processing of a vertical gate transistor.
Figure 1B:
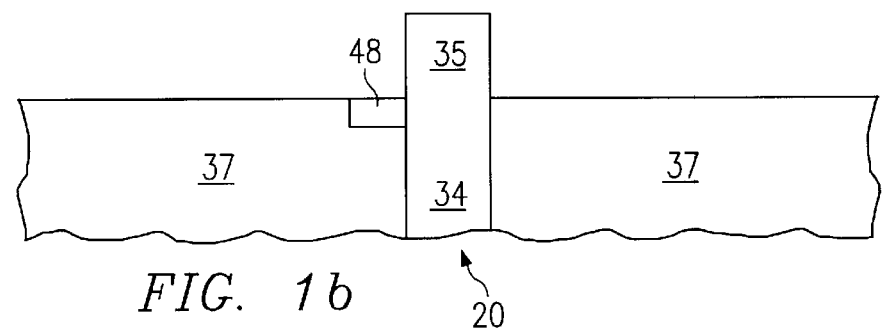

A preferred embodiment process flow for forming a memory cell with vertical and planar transistors is discussed in detail in co-pending, commonly assigned patent application 01 P 11025 US, which application is incorporated herein by reference. With reference to FIGS. 1a and 1b, the structure consists of a deep trench 20 in which has been formed a capacitor (not shown), above which has been formed a trench top oxide (TTO) 56, above which has been formed a gate polysilicon 34, including a polysilicon stud 35 that extends above the surrounding bulk silicon 37. Pad nitride layers 52 and 60 have also been formed atop the device, as shown.

The pad nitride layers are substantially removed, preferably using a hot phosphor etch, leaving only nitride cap 48 insulating gate polysilicon 34, 35 as shown in FIG. 1b. At this point, the support devices can be formed using well known planar device processing steps, as will be described in greater detail in the following paragraphs. While useful for processing a memory cell, such as illustrated in an intermediate stage in the manufacturing process is FIGS. 1a and 1b, the following description would apply to any manufacturing process in which it is desired to form and electrically connect to both vertical transistors and planar transistors, using a common electrical connection (or "wiring") layer, with a minimal amount of additional processing steps. Note that nitride layer 48 is not necessary, as the structuring of the gate conductive layer can be made with enough overlap that a contact etch would never hit the gate poly. Nitride layer 48 is advantageous, however, for dense packing of the vertical transistors and their drain contacts.

Figure 2A:
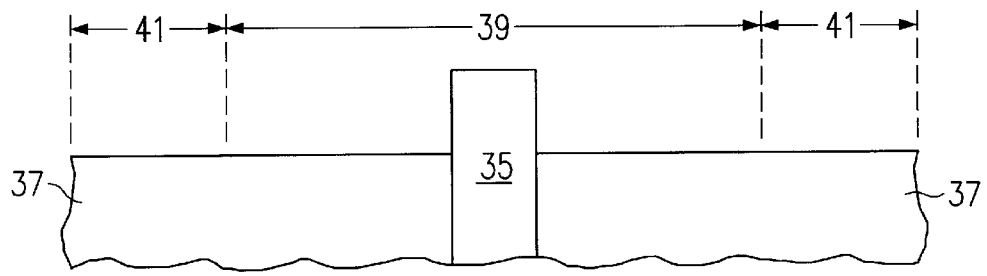
FIGS. 2a through 2h illustrate in cross-sectional view a preferred embodiment process for forming vertical and planar transistors on a common substrate.

FIG. 2a illustrates in cross-section the gate polysilicon stud 35 of a vertical transistor extending above the surface of surrounding silicon substrate 37. Other features of the device not necessary for an understanding of the invention, including nitride cap 48, have been omitted for clarity. Region 39 illustrates the portion of the substrate in which is formed doped junctions for the vertical transistor (not shown), and regions 41 illustrates the regions in which planar devices are to be formed. In order to contact both the vertical transistor and the subsequently formed planar transistors using a single wiring layer, both vertical transistor region 39 and planar device regions 41 must be planar after forming the transistors in the regions. This is accomplished as follows.

Figure 2B:
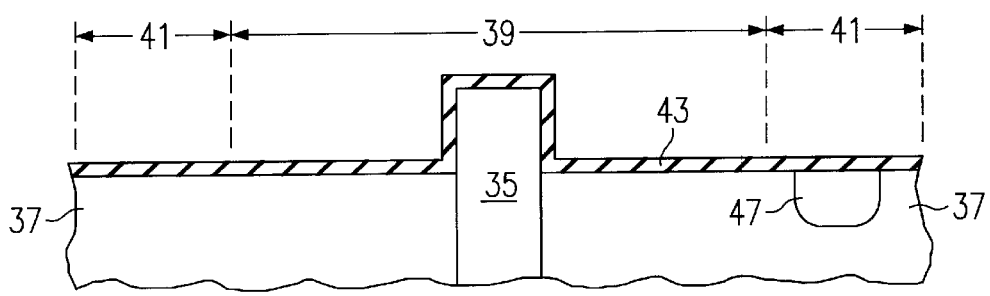
Figure 2C:
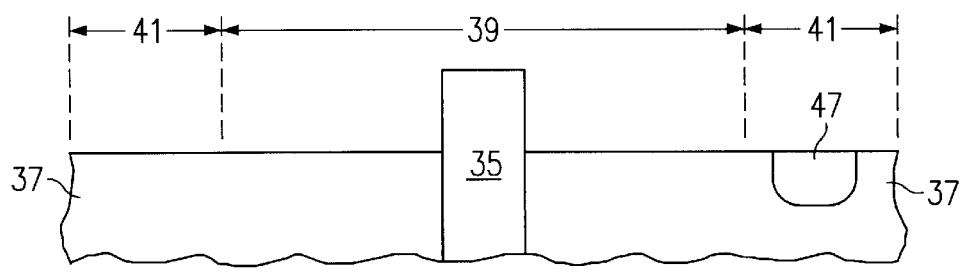

As shown in FIG. 2b, a sacrificial oxide layer 43 will first be formed on the top surface of both regions 39 and 41. This oxide layer 43 acts as a screen oxide for the subsequent implantation steps. Doped regions for the planar transistors are then formed by using well known implantation techniques. Typically, the formation of the doped transistor junctions is done after the gate stack is structured by using the gate stack as a self-aligned mask. At this point, the doped regions typically include the well and threshold Taylor implants, which are implanted through the screen sacrificial oxide. For clarity, only a single doped region 47 is illustrated as having been formed in planar region 41, although one skilled in the art will recognize that many doped regions will be formed when manufacturing various planar transistors, capacitors, and the like. The sacrificial oxide layer is then stripped off prior to subsequent processing, as shown in FIG. 2c.

Figure 2D:
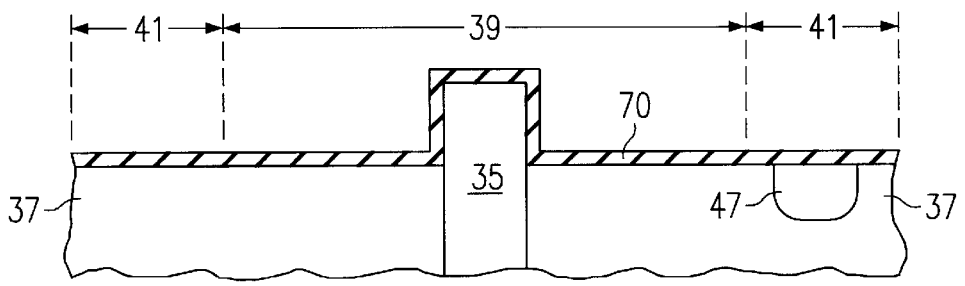
Figure 2E:
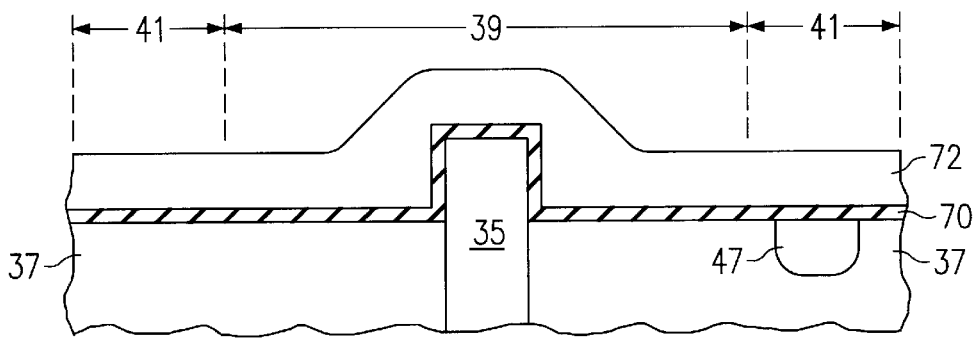
Figure 2F:
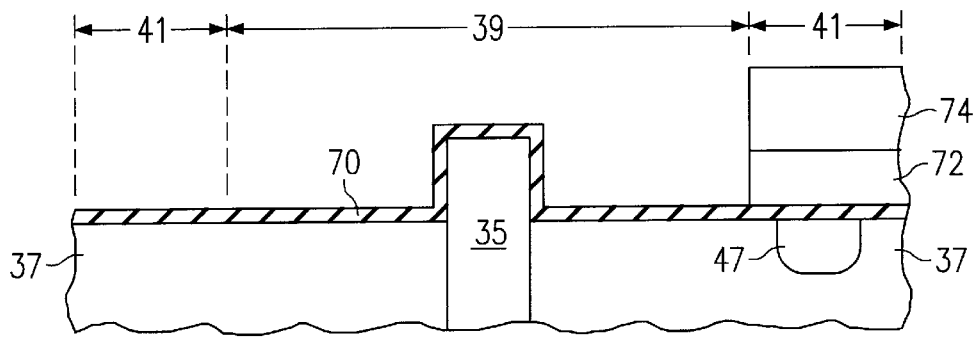

As is well known in the art, one of the process steps for forming of the planar support devices is the formation of the gate oxide. As shown in FIG. 2d, a gate oxide layer 70 is formed. Note that the gate oxide layer 70 will also form on top of the active regions of the bulk silicon and the gate polysilicon 35, as well. Polysilicon layer 72, also part of the planar device formation process, is then formed on top of the gate oxide 70, as shown in FIG. 2e. This polysilicon layer will form the gate poly for the various planar devices. A photoresist layer 74 is formed on top of polysilicon layer 72 and patterned using an etch array (EA) mask, FIG. 2f. The EA mask patterns the photoresist layer 74 such that the polysilicon layer 72 overlying active regions of the array are exposed, but the polysilicon overlying the support regions— i.e. where the planar support devices are being exposed—is protected. For convenience, photoresist layer 74 will sometimes be referred to herein as an etch array (EA) mask, even though one skilled in the art will recognize the distinction between an actual photomask that is used to selectively expose and pattern a photoresist layer and the resulting patterned layer itself. EA mask 74 is preferably an organic photoresist. Alternatively, photoresist layer 74 could be formed from silicon nitride or the like.

The exposed portions of polysilicon layer 72, i.e. the region 39 covering the array (i.e. the vertical) transistors, are next etched, using wellknown etching—processes, provided the etch step is selective to polysilicon and hence does not attack gate oxide layer 70 underlying polysilicon layer 72. After polysilicon layer 72 has been removed from the active regions, photoresist layer 74 is removed.

Figure 2G:
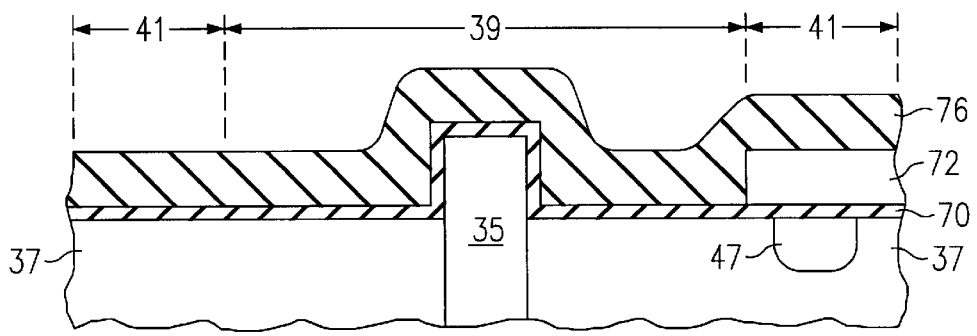
Figure 2H:
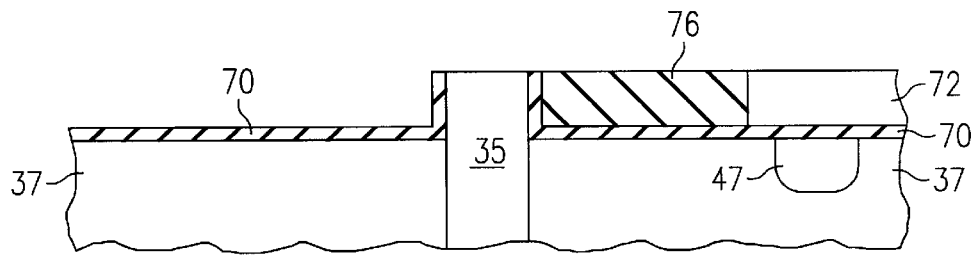

At this point, the planar devices have been processed, the array region has had the polysilicon layer 72 removed, and processing of the array transistors will now proceed by removing gate oxide layer 70 from the polysilicon stud 35 in order to allow for electrical contact to the vertical transistor gate. The next step in this process, as illustrated in FIG. 2g, is the formation of oxide layer 76. Thick oxide layer 76 is deposited using an HDP process or alternatively a TEOS deposition or other available deposition technique, such as LPCVD. Following deposition of top oxide layer 76, a Chemical Mechanical Polish (CMP) step is performed whereby top oxide layer 76, gate oxide layer 70, polysilicon layer 72, and polysilicon stud 35 are planarized, as shown in FIG. 2h. Note that the portion of gate oxide layer 70 overlying polysilicon stud 35 has been removed, thus allowing for electrical contact to be made. Note also that electrical contact can be made to polysilicon 72 (the gate layer for the planar transistors) using the same wiring level because polysilicon stud 35 and gate poly 72 are co-planar.

Figure 3A:
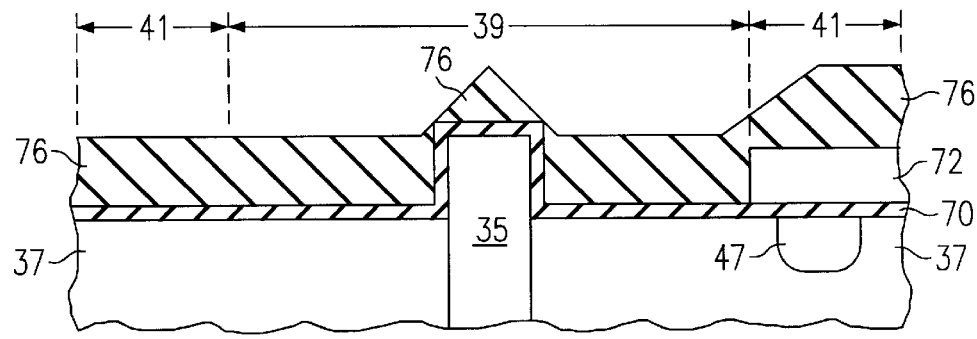
FIGS. 3a through 3e illustrate in cross-sectional view another preferred embodiment process for forming vertical and planar transistors on a common substrate.
Figure 3B:
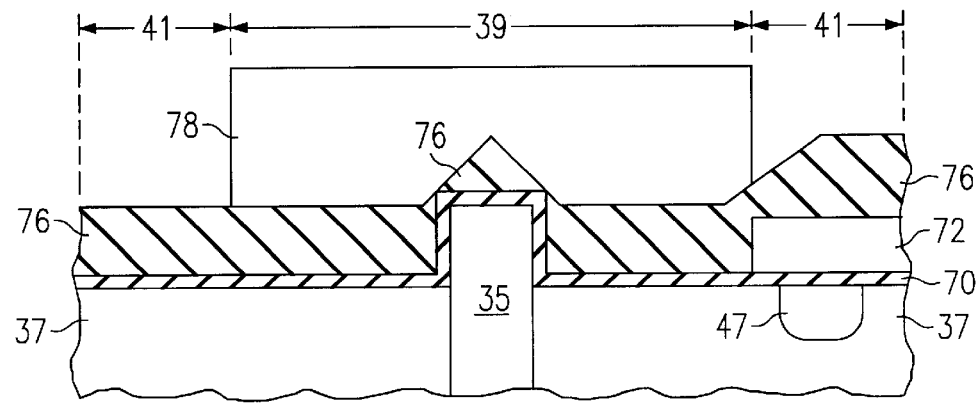
Figure 3C:
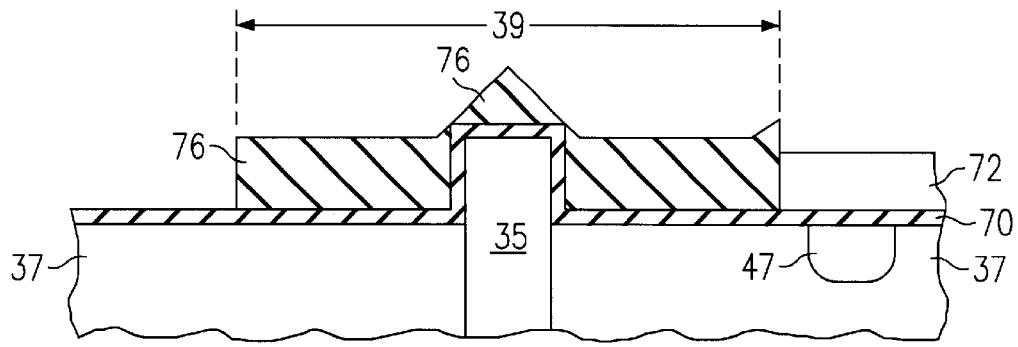

An alternative process embodiment will now be discussed with reference to FIGS. 3a through 3e. FIG. 3a illustrates the structure illustrated in FIG. 2f, after the EA mask 74 has been removed and a top oxide layer 76 has been deposited using HDP deposition. Note that a characteristic of an HDP deposited oxide layer is that the oxide is deposited from the "bottom up" and with a very shallow taper angle. As a result, only a thin region of top oxide 76 forms above polysilicon stud 35, when the stud is smaller than the oxide thickness. Generally speaking, the basic relationship is dependent on the taper angle of the deposition and the width of the stud. As a design choice, the stud size and oxide layer thickness can be selected to ensure that the oxide growth over the stud is less than the height of the desired portion of thick oxide layer 76. This characteristic is advantageous in that the thin portion of top oxide layer 76 overlying stud 35 can be easily removed e.g. by an unmasked wet etch—preferably after having stripped the support oxide with the masked etch process. As shown in FIG. 3b, thick oxide layer 76 is patterned using an etch support (ES) mask 78 (one skilled in the art will recognize that the illustrated layer 78 is actually a patterned photoresist layer that was patterned with an etch support photomask using standard photolithographic techniques; for convenience, the photoresist layer will sometimes be referred to herein as the mask). The ES mask 78 covers the array regions and exposes the support regions, hence the top oxide layer 76 is etched away in those regions where polysilicon layer 72 had been formed in the previous processing steps and remains only over the active areas, as shown in FIG. 3c (after ES etch mask 78 has been removed). In other words, EA mask 74 and ES mask 78 are complimentary to one another. ES mask 78 covers those regions of the device that were exposed by EA mask 74 and exposes those regions that were covered by EA mask 74. This feature allows for processing of the planar devices in the support region without impacting the active region transistors (e.g., by removing the polysilicon layer over the active region) and for processing of the vertical transistors in the active areas without impacting the planar devices (e.g., by removing the thick oxide layer as discussed below).

Note that the resulting structure illustrated in FIG. 3c still has a portion of top oxide layer 76 as well as the gate oxide layer 70 overlying polysilicon stud 35. As discussed above, the oxides overlying stud 35 must be removed in order to make electrical contact to the stud. This can be accomplished through either a brief CMP step or through a blanket (i.e. an unmasked) etch step. The advantage of this alternative embodiment is that it removes the necessity of a long, extensive CMP step, which is time-consuming and expensive. Because only a portion of the top oxide layer 76 remains over the stud 35, a very brief CMP can be used to planarize the top oxide layer 76. Alternatively, the layer can be etched back. Because the portion of top oxide layer 76 over the stud and also the gate oxide layer 70 are relatively much thinner than the rest of top oxide layer 76, no mask is required to etch back the oxide layer. Only a small portion of the desired top oxide layer 76 will be removed during the process, resulting in the device illustrated in FIG. 3d with a planar top surface. Note that the remaining thick oxide layer 76 insulates the active regions (i.e. the doped junctions) of the vertical transistor (not shown) from the overlying word lines. Note that the bit lines 8 actually contact the doped regions. Thick oxide layer 76 is preferably 20 to 100 nm in thickness, which is appreciably thicker than a typical gate oxide layer. This provides good insulation to the underlying doped regions and minimizes capacitive coupling as well.

Figure 3D:
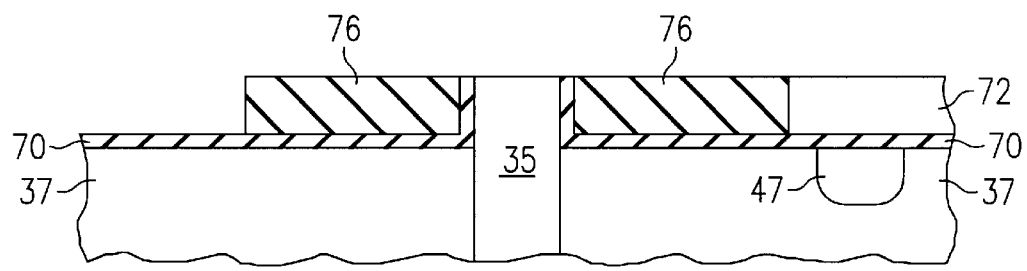
Figure 3E:
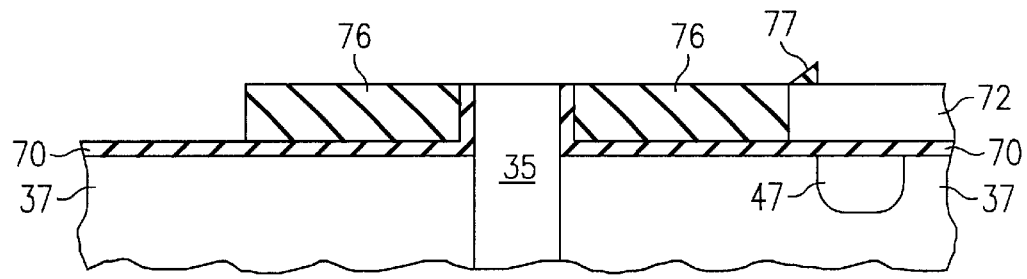
Figure 4:
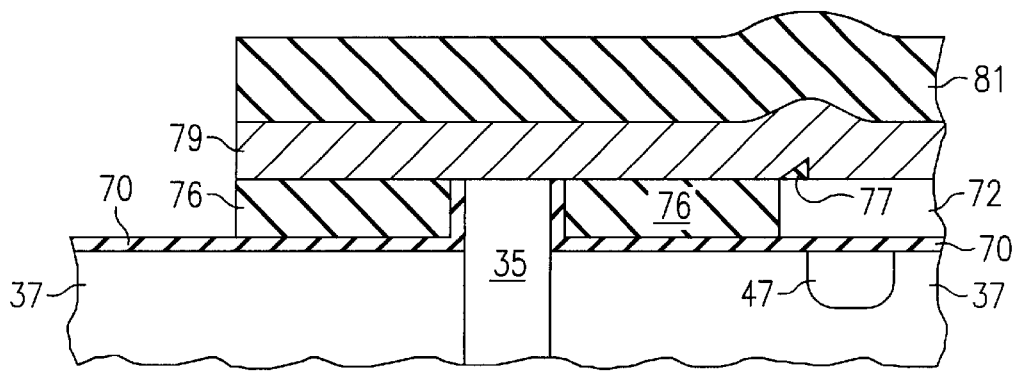
FIG. 4 illustrates in cross-sectional view additional preferred embodiment processing steps.

FIG. 3d illustrates an ideal situation in which all of top oxide layer 76 is removed from polysilicon layer 72 in the CMP or etch step. This is not always the case, however. FIG. 3e illustrates a non-ideal situation in which a portion of thick oxide layer 76, designated as 77, remains on polysilicon layer 72 after the etch step. This is an artifact of the processing steps because the oxide layer 76 is not etched back entirely in the active regions, hence it will not be etched back entirely where it overlaps with the polysilicon layer. Although this feature 77 is not desirable because it decreases the planarity of the resulting structure (as illustrated in FIG. 4), it does not degrade performance or yield appreciably. Use of CMP to remove top oxide layer 76 will avoid this feature 77, albeit at a slightly higher manufacturing cost.

After planarizing the thick oxide layer 76, an oxide clean step is performed to remove any oxide that has been formed over the gate polysilicon 35. This is preferably a wet etch process, such as HF. This top oxide layer prevents parasitic capacitances from forming between the bit line (basically doped regions in the substrate) and the gate conductive layer. Subsequent to the oxide clean up, the word line conductor stack 79 can be formed, as shown in FIG. 4. The word lines are preferably a multi-layer stack of polysilicon and tungsten. Alternatively, the conductors can be formed of a single layer or a combination of layers comprising polysilicon, tungsten, tungsten nitride, tungsten silicon, tantalum nitride, or other well-known alternatives. Note that a single level of conductor can be used to connect to both the vertical transistor gate as well as to the support (planar) transistor gates. Nitride cap 81 is then formed over the conductor using well-known nitride deposition processing, such as CVD. Note the hump formed in the word line caused by the oxide artifact 77. Care must be taken to ensure that the word line makes good coverage over this region.

Note that the top surface of nitride cap 81 is substantially planar, having a similar height over both the array regions (i.e. over the deep trench and vertical transistor regions) and the support regions (i.e. the regions where the planar support transistors are formed). This advantageous feature is accomplished by removing polysilicon layer 72 in the array regions, forming thick oxide layer 76 in those regions, and removing the thick oxide layer from the support regions where polysilicon layer 72 remains intact. This is accomplished simply by the EA mask and etch followed by the ES mask and etch steps or CMP steps as described above.

A further advantageous feature of the preferred embodiments of the present invention is that the thick oxide layer 76 is formed relatively late in the processing steps. In this way, the oxide layer is not subjected to multiple implant or diffusion or etch steps that would require additional processing, such as oxide cleans, wet etches, and the like. Another advantageous feature of the preferred embodiments is that the gate oxide for the planar support devices is removed from the array devices during processing (i.e. the vertical transistors). This is necessary because the vertical transistor gate oxide is previously formed on the sidewalls of the trench (as described in detail in co-pending, commonly assigned patent application 01 P 11025 US).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For instance, exemplary insulative materials have been disclosed, such as oxide and nitride, although in some instances these materials can be substituted for each other, or other insulative materials could be employed. Conductive materials have also been disclosed, but it is within the scope of the present invention to employ other combinations of the disclosed or other conductive materials, such as now commonly employed in the art or subsequently developed. Certain spacings and dimensions have been disclosed regarding the currently contemplated best mode of the invention. These dimensions are not intended to be limiting in any manner and the present invention contemplates larger or smaller devices. Additionally, the present teaching may be applicable to other semiconductor materials and process, such as Germanium, Gallium-Arsenide, other III–IV materials, or other semiconductor materials. Other etch processes than specifically described above are within the scope of the present invention, including reactive ion etching (RIE), wet etching, dry etching, plasma etching, and the like. Likewise, the deposition techniques described herein are exemplary, rather than limiting and the present invention is broad enough to include other deposition techniques such as CVD, PVD, PEVD, thermal oxidation, and the like. Furthermore, while specific embodiments have been described with reference to a memory cell, it is within the scope and spirit of the present invention that the teaching contained herein apply to any type of circuit in which it is desired to provide both vertical transistors and gate transistors and to preferably connect to both types of devices with a single conductor level. It is intended that the appended claims encompass any such modifications or embodiments.

What is claimed:

1. A method for forming one wiring connection for vertical and planar transistors in an electrical circuit on a substrate, the substrate having a surface including regions comprising vertical transistors formed therein and other regions comprising planar transistors formed therein, comprising:

forming a vertical transistor on a sidewall of a trench formed within the surface, having a vertical gate formed within the trench and extending above the surface;

growing a planar gate oxide over both the surface and the vertical gate;

depositing a conductive layer on the surface;

forming an etch mask on top of the conductive layer, the etch mask exposing the regions comprising vertical transistors formed therein and covering the regions comprising planar transistors formed therein;

etching the conductive layer in the exposed regions;

removing the etch mask;

forming an oxide layer on the surface;

removing the oxide layer from the regions comprising planar transistors formed therein and from the vertical gate; and forming a conductor above and contacting the vertical gate, wherein the conductor is insulated from doped regions adjacent the trench by the oxide layer.

2. The method of claim 1, where the step of removing the oxide layer comprises:

forming a second etch mask on top of the oxide layer, the second etch mask exposing the regions comprising planar transistors formed therein and covering the regions comprising vertical transistors formed therein; and etching the oxide layer in the exposed regions;

removing the second etch mask; and planarizing the oxide layer remaining after the etch by chemical mechanical polishing.

3. The method of claim 1, where the step of removing the oxide layer comprises:

chemical mechanical polishing the oxide layer down to the level of the vertical gate extending above the surface in the regions comprising vertical transistors formed therein and down to the conductive layer in regions comprising planar transistors formed therein.

4. The method of claim 1, where the oxide layer is formed with a non-conformal deposition and where the method further comprises:

forming a second etch mask on top of the oxide layer, the second etch mask exposing the regions comprising planar transistors formed therein and covering the regions comprising vertical transistors formed therein; and etching the oxide layer in the exposed regions;

removing the second etch mask; and performing a blanket etch on the oxide layer to expose the vertical gate extending above the surface.

5. The method of claim 1 wherein the oxide layer is in the range of 20 to 150 nm in thickness.

6. The method of claim 1 wherein the electrical circuit comprises a capacitor and vertical transistor gate formed within the trench and at least one doped region formed adjacent the trench.

7. The method of claim 1 wherein the planar transistors comprise a sense amplifier.

8. The method of claim 1 wherein the oxide layer is formed from an HDP deposition.

9. The method of claim 1 wherein the oxide layer is formed using TEOS deposition.

10. The method of claim 2 wherein the first etch mask and the second etch mask are complimentary.

11. The method of claim 1, wherein the vertical gate is formed of polysilicon.

12. The method of claim 1, wherein the conductive layer is formed of polysilicon, tungsten, tungsten nitride, titanium, titanium nitride, or a silicide.

13. The method of claim 1 wherein the conductor is substantially planar.

14. The method of claim 1 wherein the etch mask comprises an insulator and a photoresist material.

15. The method of claim 14 wherein the insulator comprises an oxide or a nitride.

* * * * *